United States Patent
Cho et al.

(10) Patent No.: US 11,600,511 B2
(45) Date of Patent: Mar. 7, 2023

(54) SUBSTRATE PROCESSING APPARATUS

(71) Applicant: SAMSUNG ELECTRONICS CO., LTD., Suwon-si (KR)

(72) Inventors: Kihong Cho, Suwon-si (KR); Kyuchul Shim, Hwaseong-si (KR); Chungho Cho, Suwon-si (KR); Jiho Uh, Seoul (KR); Jinseok Lee, Seoul (KR); Namki Cho, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 43 days.

(21) Appl. No.: 17/189,392

(22) Filed: Mar. 2, 2021

(65) Prior Publication Data

US 2021/0296153 A1 Sep. 23, 2021

(30) Foreign Application Priority Data

Mar. 19, 2020 (KR) .................. 10-2020-0034061

(51) Int. Cl.
*H01L 21/683* (2006.01)
*H02N 13/00* (2006.01)
*H01J 37/32* (2006.01)

(52) U.S. Cl.
CPC ...... *H01L 21/6833* (2013.01); *H01J 37/3255* (2013.01); *H01J 37/32541* (2013.01); *H01J 37/32642* (2013.01); *H02N 13/00* (2013.01); *H01J 2237/334* (2013.01)

(58) Field of Classification Search
CPC ............... H01L 21/6833; H02N 13/00
See application file for complete search history.

(56) References Cited

U.S. PATENT DOCUMENTS

| | | | | |
|---|---|---|---|---|
| 5,868,848 A | * | 2/1999 | Tsukamoto | H01L 21/67253 204/298.34 |
| 6,074,518 A | * | 6/2000 | Imafuku | H01J 37/32623 156/345.46 |
| 6,676,804 B1 | * | 1/2004 | Koshimizu | H01J 37/32642 118/724 |
| 7,882,800 B2 | * | 2/2011 | Koshiishi | H01J 37/32642 156/915 |
| 8,084,375 B2 | | 12/2011 | Koshiishi et al. | |
| 8,270,141 B2 | | 9/2012 | Willwerth et al. | |
| 2006/0283553 A1 | | 12/2006 | Ma et al. | |
| 2009/0120367 A1 | * | 5/2009 | Porshnev | H01J 37/32642 118/723 E |
| 2017/0011891 A1 | | 1/2017 | Hammond, IV et al. | |

(Continued)

FOREIGN PATENT DOCUMENTS

| | | |
|---|---|---|
| JP | 2019-176017 A | 10/2019 |
| JP | 2019-207960 A | 12/2019 |
| KR | 10-1722382 B1 | 4/2017 |

*Primary Examiner* — Scott Bauer
(74) *Attorney, Agent, or Firm* — Lee IP Law, P.C.

(57) ABSTRACT

A substrate processing apparatus including an electrostatic chuck on which a substrate is mountable; a ring surrounding the electrostatic chuck, the ring including a first coupling groove; and a first floating electrode in the first coupling groove of the ring, the first floating electrode having a ring shape, wherein a top surface of the first floating electrode is exposed at the ring, and the first floating electrode has a tapered shape including an inclined surface that is inclined in a downward direction toward the electrostatic chuck.

10 Claims, 4 Drawing Sheets

(56) References Cited

U.S. PATENT DOCUMENTS

2018/0218884 A1 8/2018 Yamawaku et al.
2019/0006156 A1 1/2019 Seo et al.
2019/0371575 A1 12/2019 Uchida et al.
2019/0385891 A1 12/2019 Chang et al.

* cited by examiner

SUBSTRATE PROCESSING APPARATUS

CROSS-REFERENCE TO RELATED APPLICATION

Korean Patent Application No. 10-2020-0034061, filed on Mar. 19, 2020, in the Korean Intellectual Property Office, and entitled: "Substrate Processing Apparatus," is incorporated by reference herein in its entirety.

BACKGROUND

1. Field

Embodiments relate to a substrate processing apparatus.

2. Description of the Related Art

A substrate processing apparatus may include an electrostatic chuck (ESC) configured to mount or accommodate a substrate thereon and process the substrate using plasma.

SUMMARY

The embodiments may be realized by providing a substrate processing apparatus including an electrostatic chuck on which a substrate is mountable; a ring surrounding the electrostatic chuck, the ring including a first coupling groove; and a first floating electrode in the first coupling groove of the ring, the first floating electrode having a ring shape, wherein a top surface of the first floating electrode is exposed at the ring, and the first floating electrode has a tapered shape including an inclined surface that is inclined in a downward direction toward the electrostatic chuck.

The embodiments may be realized by providing a substrate processing apparatus including an electrostatic chuck on which a substrate is mountable; a first ring surrounding an edge of the electrostatic chuck; a second ring surrounding an edge of the first ring, the second ring including a coupling groove and a protrusion groove under the coupling groove; and a floating electrode in the coupling groove of the second ring, the floating electrode having a ring shape and side surfaces of the floating electrode being surrounded by the second ring, wherein a top surface of the floating electrode is exposed at the second ring, and the floating electrode includes an inclined portion including an inclined surface that is inclined in a downward direction toward the electrostatic chuck; a flat portion outside the inclined portion, the flat portion having a planar surface aligned with a portion of a top surface of the second ring; and a protrusion portion at a bottom side of the floating electrode, the protrusion portion being in the protrusion groove of the second ring.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
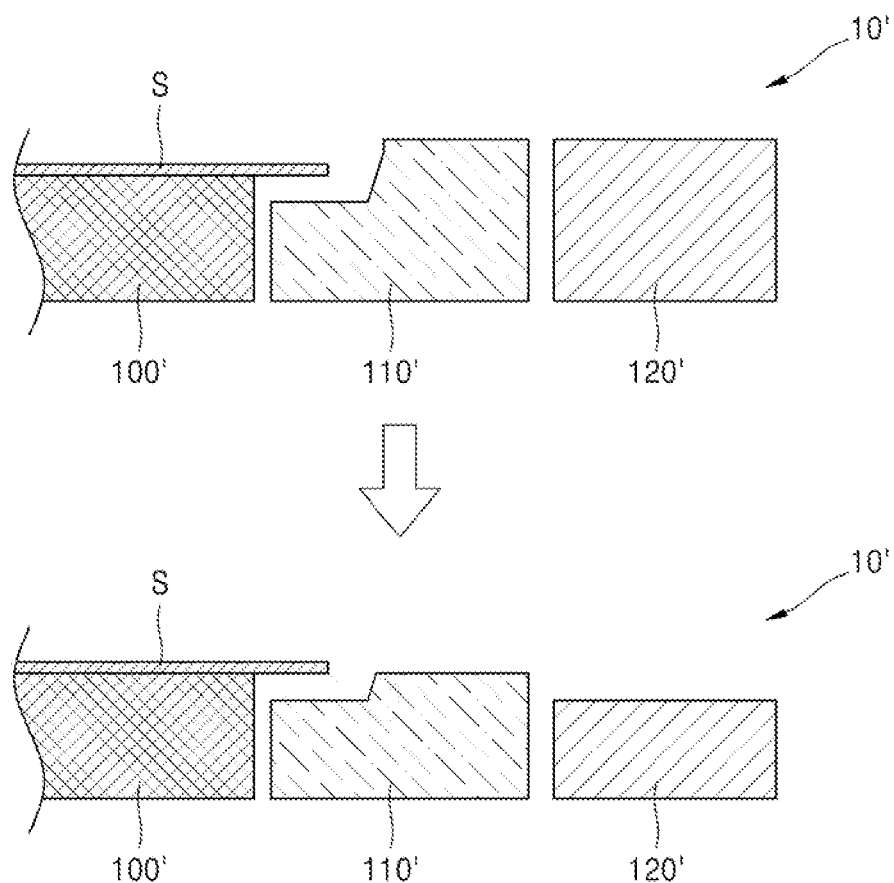
FIG. 1 is a cross-sectional view of a substrate processing apparatus according to a comparative example.

FIG. 1 is a cross-sectional view of a substrate processing apparatus 10' according to a comparative example.

Referring to FIG. 1, the substrate processing apparatus 10' according to the comparative example may be an apparatus configured to generate plasma and etch a substrate S by using the generated plasma. The substrate processing apparatus 10' may include an electrostatic chuck (ESC) 100', a first ring 110', and a second ring 120'.

The ESC 100' may be a device configured to mount or hold the substrate S by electrostatic force. The first ring 110' may be a ring surrounding an (outer) edge of the ESC 100', and the second ring 120' may be a ring surrounding an (outer) edge of the first ring 110'.

The first ring 110' and the second ring 120' may affect a shape of plasma generated by the substrate processing apparatus 10'. For example, shapes, surface roughnesses, and heights of the first ring 110' and the second ring 120' may change the shape of plasma generated in the substrate processing apparatus 10'.

In addition, the first ring 110' and the second ring 120' may be etched by a physical or chemical reaction using a plurality of repetitive substrate processing processes. Thus, the shapes, surface roughnesses, and heights of the first ring 110' and the second ring 120' may be changed as shown in FIG. 1.

Changes in the shapes, surface roughnesses, and heights of the first ring 110' and the second ring 120' could reduce the yield of a substrate processing process. For example, the changes in the shapes, surface roughnesses, and heights of the first ring 110' and the second ring 120' may lead to a change in a shape of plasma generated during the substrate processing process. Plasma having the changed shape may reduce the yield of an etching process, especially near an edge of the substrate S.

For example, due to the plasma having the changed shape, etching holes that should have originally been formed in a vertical direction in the edge of the substrate may be formed to be inclined with respect to the vertical direction. In addition, due to the plasma having the changed shape, a plurality of adjacent etching holes that should have originally been apart from each other may be connected to each other. As a result, semiconductor devices formed by using the substrate S may have defects.

Hereinafter, substrate processing apparatuses according to embodiments will be described in more detail with reference to the drawings.

Figure 2:
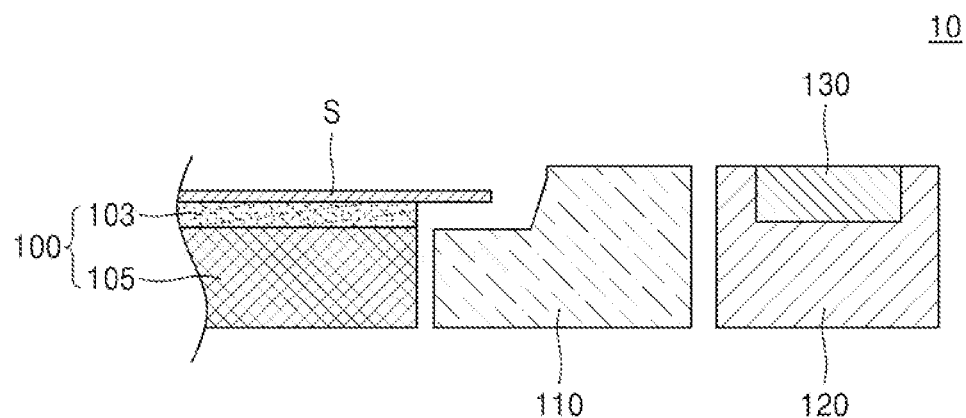
FIG. 2 is a cross-sectional view of a substrate processing apparatus according to an example embodiment.

FIG. 2 is a cross-sectional view of a substrate processing apparatus 10 according to an example embodiment. The substrate processing apparatus 10 according to the present embodiment may be an apparatus configured to fix or accommodate a substrate S and etch a portion of the substrate S by using plasma. Referring to FIG. 2, the substrate processing apparatus 10 according to the present embodiment may include an ESC 100, a first ring 110, a second ring 120, and a first floating electrode 130.

The ESC 100 may be a chuck configured to fix, accommodate, or otherwise hold the substrate S, e.g., by electrostatic force. The ESC 100 may include a chuck plate 103 and a body 105. In an implementation, the chuck plate 103 may be an upper portion of the ESC 100 and a plate on which the substrate S is mounted. In an implementation, the substrate S mounted on the chuck plate 103 may be a wafer before semiconductor devices are formed or a wafer on which semiconductor devices are formed.

The body 105 may include a pedestal under the chuck plate 103. In an implementation, the body 105 may have a cylindrical shape. In an implementation, an electrostatic plate, a heating plate, and a cooling plate may be included in the body 105. As used herein, the term "or" is not an exclusive term, e.g., "A or B" would include A, B, or A and B.

In an implementation, the electrostatic plate may be a plate configured to generate electrostatic force under the chuck plate 103. Due to the electrostatic force generated by the electrostatic plate, the substrate S may be fixedly mounted on the chuck plate 103. Also, the heating plate may be a plate configured to emit heat to the substrate S mounted on the chuck plate 103 to heat the substrate S. In addition, the cooling plate may be a plate including a cooling water flow path to cool the substrate S mounted on the chuck plate 103.

The first ring 110 may surround the outer edge of the ESC 100. In an implementation, the first ring 110 may be between the ESC 100 and the second ring 120.

In an implementation, the first ring 110 may include, e.g., silicon carbide (SiC) or silicon (Si). In an implementation, and the first ring 110 may include various other materials.

The second ring 120 may surround the outer edge of the first ring 110. In an implementation, the second ring 120 may have a first coupling groove (refer to 120H_1 in FIG. 4) in an upper portion thereof such that the first floating electrode 130, which will be described below, may be inserted into or accommodated in the first coupling groove 120H_1.

In an implementation, the second ring 120 may prevent physical contact between the first ring 110 and the first floating electrode 130. In an implementation, the second ring 120 may prevent physical contact between the first ring 110 and electrical components included in the substrate processing apparatus 10. In an implementation, the second ring 120 may be spaced apart from the first ring 110 in a lateral direction.

In an implementation, the second ring 120 may include a quartz material. In an implementation, and the second ring 120 may include various other materials.

In an implementation, the second ring 120 may surround or cover side surfaces of the first floating electrode 130 (e.g., when the first floating electrode 130 is accommodated in the first coupling groove). In an implementation, the second ring 120 may surround the side surfaces of the first floating electrode 130 in such a manner that the side surfaces of the first floating electrode 130 are not exposed (e.g., are covered). In an implementation, the second ring 120 may expose a top surface of the first floating electrode 130.

The second ring 120 may surround the side surfaces of the first floating electrode 130, and a portion of the second ring 120 may be between the first ring 110 and the first floating electrode 130. The portion of the second ring 120, which is between the first ring 110 and the first floating electrode 130, may help prevent the physical contact between the first ring 110 and the first floating electrode 130. Thus, a plasma abnormal discharge phenomenon (e.g., an arcing phenomenon) caused by a contact of the first ring 110 with the first floating electrode 130 may be inhibited. Also, the scattering of particles due to the contact of the first ring 110 with the first floating electrode 130 may be inhibited.

The first floating electrode 130 may be a ring-shaped electrode, which may be inserted into the first coupling groove 120H_1 of the second ring 120, and may have side surfaces surrounded or covered by a portion of the second ring 120. The first floating electrode 130 may be on the second ring 120 and may be an electrode that is neither applied with a voltage nor grounded. The first floating electrode 130 may be an electrode configured to easily generate plasma due to an electric field crowding effect during a substrate processing process.

In an implementation, the first floating electrode 130 may include a ceramic material having a higher corrosion resistance than the second ring 120. In an implementation, when the second ring 120 includes quartz, the first floating electrode 130 may include, e.g., silicon carbide (SiC), silicon (Si), tungsten carbide (WC), boron carbide ($B_4C$), aluminum oxide ($Al_2O_3$), or yttrium oxide ($Y_2O_3$).

In an implementation, the first floating electrode 130 may be separated or removed from the second ring 120 in a vertical direction by a separate transfer member. In an implementation, when the first floating electrode 130 is etched due to a physical or chemical reaction during a substrate processing process, the etched first floating electrode 130 may be separated or removed from the second ring 120 in the vertical direction by a transfer member, and a new first floating electrode 130 may be inserted into the first coupling groove 120H_1 of the second ring 120.

In an implementation, a top surface of the first floating electrode 130 may be exposed to the outside (e.g., may not be covered by the second ring 120). In an implementation, the top surface of the first floating electrode 130 may be substantially coplanar with a top surface of the second ring 120. In an implementation, the top surface of the first floating electrode 130 may be aligned with the top surface of the second ring 120.

Profiles of the top surfaces of the first floating electrode 130 and the second ring 120 according to the present embodiment may be substantially the same as or similar to a profile of a top surface of another type of second ring that does not include a first floating electrode. Thus, a shape of plasma according to the profiles of the top surfaces of the first floating electrode 130 and the second ring 120 may be easily predicted, and the yield of the substrate processing process may be improved.

The substrate processing apparatus 10 according to the example embodiment may include the first floating electrode 130, which is in an upper portion of the second ring 120 and includes a material having a higher corrosion resistance than the second ring 120, and damage to the first floating electrode 130 and the second ring 120 due to the physical or chemical reaction may be inhibited during the substrate processing process.

Accordingly, the substrate processing apparatus 10 according to the present embodiment may generate plasma having a uniform shape during the substrate processing process and increase the yield of the substrate processing process. In an implementation, in the substrate processing apparatus 10, a plurality of etching holes of which an inclination angle with respect to the vertical direction is reduced may be formed in the substrate S.

Figure 3:
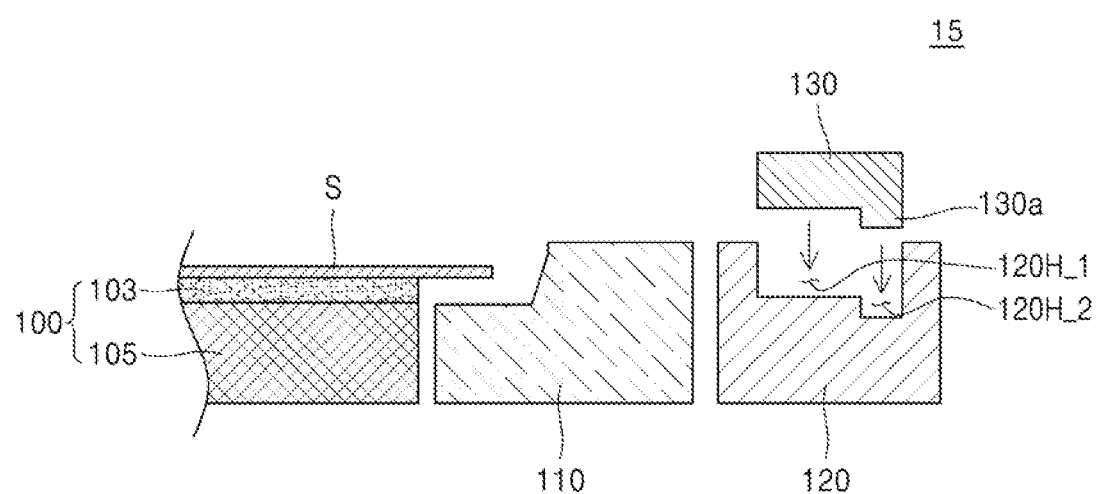
FIG. 3 is an exploded cross-sectional view of a substrate processing apparatus according to an example embodiment.

FIG. 3 is an exploded cross-sectional view of a substrate processing apparatus 15 according to an example embodiment. The same descriptions as given with respect to the substrate processing apparatus 10 of FIG. 2 may be omitted for brevity, and differences between the substrate processing apparatuses 10 and 15 of FIGS. 2 and 3 may be mainly described.

Referring to FIG. 3, a first floating electrode 130 of the substrate processing apparatus 15 may further include a first coupling protrusion 130a at a lower portion thereof. In an implementation, a second ring 120 may further include a first protrusion groove 120H_2, which may be adjacent to and under or deeper than a first coupling groove 120H_1, and may contain or accommodate the first coupling protrusion 130a of the first floating electrode 130. In an implementation, the first protrusion groove 120H_2 and the first coupling groove 120H_1 may have a shape that is complementary to that of the first floating electrode 130 such that the first floating electrode 130 may be accommodated therein.

The first floating electrode 130 of the substrate processing apparatus 15 according to the present embodiment may further include the first coupling protrusion 130a and the second ring 120 may further include the first protrusion groove 120H_2 configured to contain the first coupling protrusion 130a, and the first floating electrode 130 may be easily inserted into or accommodated in the first coupling groove 120H_1 of the second ring 120. Thus, the first floating electrode 130 may be easily aligned with the second ring 120, and asymmetric alignment of the first floating electrode 130 with the second ring 120 may be improved.

Figure 4:
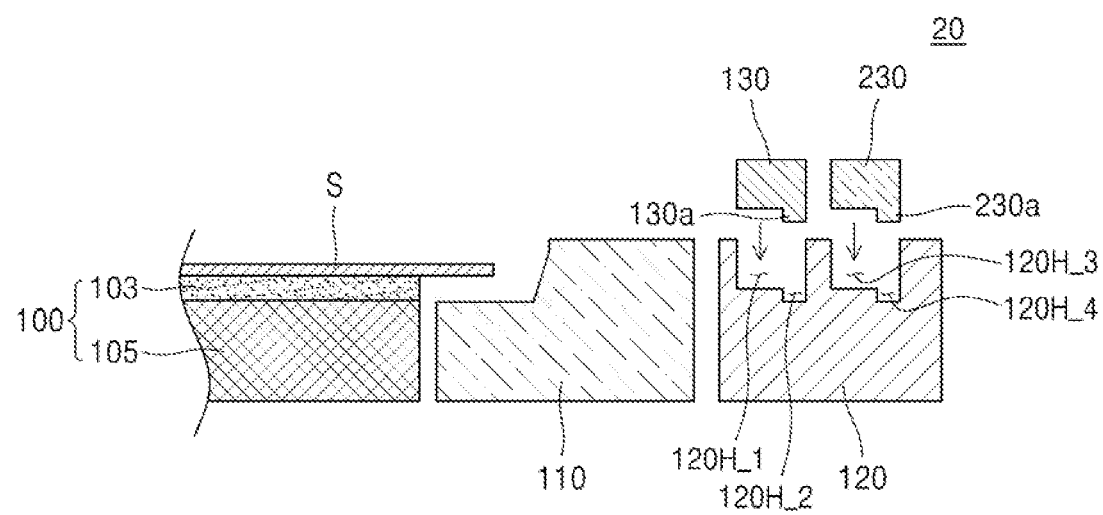
FIG. 4 is an exploded cross-sectional view of a substrate processing apparatus according to an example embodiment.

FIG. 4 is an exploded cross-sectional view of a substrate processing apparatus 20 according to an example embodiment. The same descriptions as given with respect to the substrate processing apparatus 15 of FIG. 3 may be omitted for brevity, and differences between the substrate processing apparatuses 15 and 20 of FIGS. 3 and 4 may be mainly described.

Referring to FIG. 4, the substrate processing apparatus 20 may include a first floating electrode 130 and a second floating electrode 230 outside the first floating electrode 130. The second floating electrode 230 may be inserted into or accommodated in a second ring 120 to surround an outer edge of the first floating electrode 130. The second floating electrode 230 may be on the second ring 120 and may be an electrode that is neither applied with a voltage nor grounded. The second floating electrode 230 may be an electrode configured to easily generate plasma along with the first floating electrode 130 due to an electric field crowding effect during a substrate processing process.

As described above, the first floating electrode 130 may further include a first coupling protrusion 130a. Also, the second floating electrode 230 may further include a second coupling protrusion 230a at a lower portion thereof.

In an implementation, the second ring 120 may include a first coupling groove 120H_1 and a first protrusion groove 120H_2. In an implementation, the second ring 120 may further include a second coupling groove 120H_3 outside the first coupling groove 120H_1 and a second protrusion groove 120H_4 adjacent to and under or deeper than the second coupling groove 120H_3 to contain or accommodate the second coupling protrusion 230a of the second floating electrode 230.

The second floating electrode 230 of the substrate processing apparatus 15 according to the present embodiment may include the second coupling protrusion 230a and the second ring 120 may include the second protrusion groove 120H_4 configured to contain or accommodate the second coupling protrusion 230a, and the second floating electrode 230 may be easily inserted into or accommodated the second coupling groove 120H_3 of the second ring 120 (e.g., due to complementary shapes thereof). In an implementation, the second floating electrode 230 may be easily aligned with the second ring 120, and asymmetric alignment of the second floating electrode 230 with the second ring 120 may be improved.

In an implementation, the first floating electrode 130 and the second floating electrode 230 may be spaced apart from each other. In an implementation, side surfaces of the first floating electrode 130 and side surfaces of the second floating electrode 230 may be surrounded or covered by the second ring 120.

In an implementation, the first floating electrode 130 may come in contact with the second floating electrode 230. In an implementation, an outer surface of the first floating electrode 130 may come in contact with an inner surface of the second floating electrode 230. In an implementation, the outer surface of the first floating electrode 130 and the outer surface of the second floating electrode 230 may be surrounded by the second ring 120.

In an implementation, the second floating electrode 230 may include a ceramic material having a higher corrosion resistance than the second ring 120. In an implementation, when the second ring 120 includes quartz, the second floating electrode 230 may include, e.g., silicon carbide (SiC), silicon (Si), tungsten carbide (WC), boron carbide ($B_4C$), aluminum oxide ($Al_2O_3$), or yttrium oxide ($Y_2O_3$).

In an implementation, the second floating electrode 230 may include a substantially different material from the first floating electrode 130. In an implementation, types of materials of the first floating electrode 130 and the second floating electrode 230 may be determined based on a concentration of plasma generated during the substrate processing process.

In an implementation, when plasma having a relatively high concentration is generated over the first floating electrode 130, the first floating electrode 130 may include a material having a higher corrosion resistance than the second floating electrode 230. In an implementation, plasma having a relatively high concentration may be generated over the second floating electrode 230. In this case, the second floating electrode 230 may include a material having a higher corrosion resistance than the first floating electrode 130.

In an implementation, the first floating electrode 130 and the second floating electrode 230 may be separated or removed from the second ring 120 in a vertical direction by a separate transfer member. In an implementation, when at least one of the first floating electrode 130 and the second floating electrode 230 is etched due to a physical or chemical reaction during a substrate processing process, at least one of the first floating electrode 130 and the second floating electrode 230 may be separated from the second ring 120 in the vertical direction by the transfer member.

In an implementation, a top surface of the first floating electrode 130, a top surface of the second floating electrode 230, and a top surface of the second ring 120 may be at substantially the same level. In an implementation, the top surface of the first floating electrode 130 and the top surface of the second floating electrode 230 may be aligned or coplanar with the second ring 120. In an implementation, profiles of the top surfaces of the first floating electrode 130, the second floating electrode 230, and the second ring 120 may be substantially the same as or similar to a profile of a top surface of another type of second ring that does not include a first floating electrode and a second floating electrode. Accordingly, a shape of plasma according to the profiles of the top surfaces of the first floating electrode 130, the second floating electrode 230, and the second ring 120 may be easily predicted, and the yield of the substrate processing process may be improved.

In an implementation, as illustrated in the drawings, the substrate processing apparatus 20 according to the present embodiment may include two floating electrodes, or the substrate processing apparatus 20 may include three or more floating electrodes.

Figure 5:
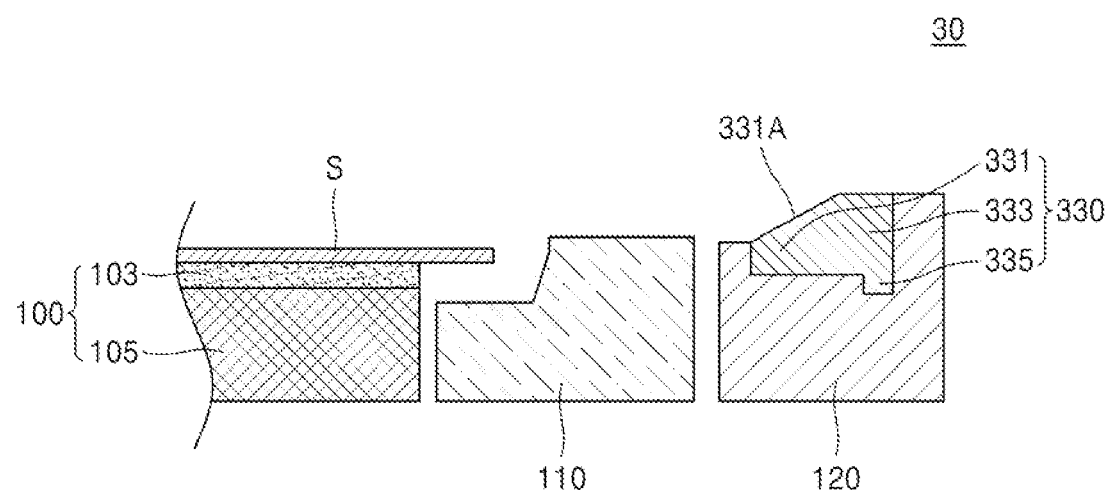
FIG. 5 is a cross-sectional view of a substrate processing apparatus according to an example embodiment.
Figure 6:
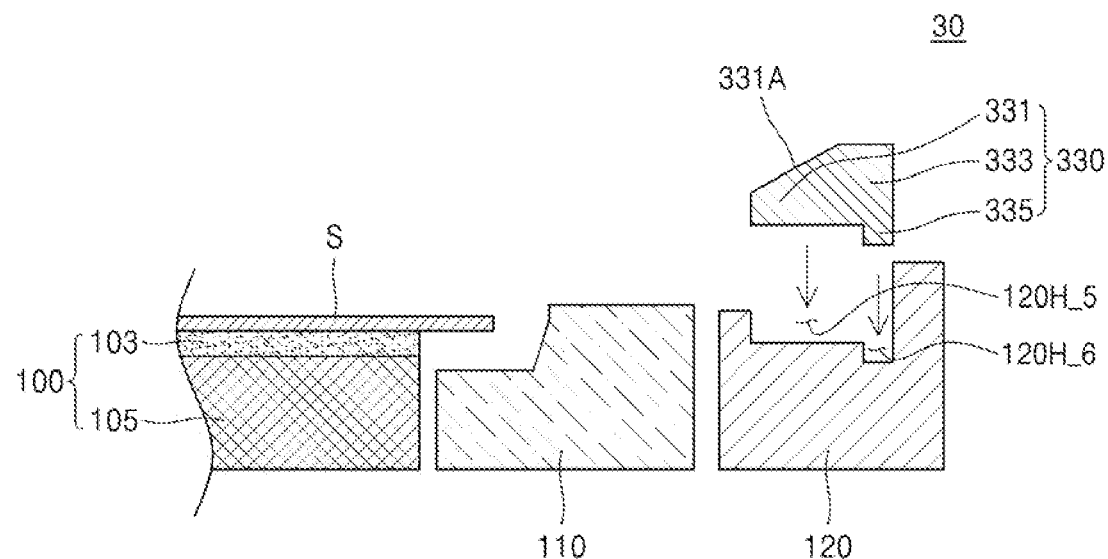
FIG. 6 is an exploded cross-sectional view of a substrate processing apparatus according to an example embodiment.

FIG. 5 is a cross-sectional view of a substrate processing apparatus 30 according to an example embodiment. FIG. 6 is an exploded cross-sectional view of the substrate processing apparatus 30 according to the example embodiment. The same descriptions as given with respect to the substrate processing apparatus 15 of FIG. 3 may be omitted for brevity, and differences between the substrate processing apparatus 15 of FIG. 3 and the substrate processing apparatus 30 of FIGS. 5 and 6 may be mainly described.

Referring to FIGS. 5 and 6, the substrate processing apparatus 30 according to the example embodiment may include a third floating electrode 330, which may be exposed at a second ring 120 and may have an inclined surface 331A that is inclined in a downward direction toward the ESC 100. In addition, the third floating electrode 330 may be a ring having a tapered hole of which a sectional area increases in an upward or outward (e.g., radial) direction.

In an implementation, the third floating electrode 330 may include an inclined portion 331, a flat portion 333, and a protrusion portion 335. In an implementation, the third floating electrode 330 may be inserted into or accommodated in a third coupling groove 120H_5 of the second ring 120.

In an implementation, the inclined portion 331 may be a portion of the third floating electrode 330 having the inclined surface 331A described above. The inclined surface 331A of the inclined portion 331 may be exposed at or on the second ring 120.

In an implementation, the inclined surface 331A of the third floating electrode 330 may have an inclination angle of about 20° to about 60°.

In an implementation, the flat portion 333 may be outside the inclined portion 331, and may be a portion of the third floating electrode 330, which has a planar surface that is aligned or coplanar with a portion of a top surface of the second ring 120.

In an implementation, the protrusion portion 335 may be under the flat portion 333, and may be a portion of the third floating electrode 330, which is inserted into or accommodated in a third protrusion groove 120H_6 of the second ring 120.

In an implementation, a bottom-level portion of the inclined surface 331A of the third floating electrode 330 (e.g., a portion where a slope starts inside the third floating electrode 330) may be at substantially the same level as a bottom-level portion of the top surface of the second ring 120. In an implementation, a top-level portion of the inclined surface 331A of the third floating electrode 330 (e.g., a portion where the slope ends outside the third floating electrode 330) may be at substantially the same level as a top-level portion of the top surface of the second ring 120.

In an implementation, as compared to a substrate processing apparatus including flat floating electrodes, each of which does not include the inclined surface 331A, the substrate processing apparatus 30 including the third floating electrode 330 according to the present embodiment, may help reduce physically or chemically etched amounts of the third floating electrode 330 and the second ring 120 during the substrate processing process. Thus, the substrate processing apparatus 30 according to the present embodiment may generate plasma having a uniform shape during the substrate processing process and improve the yield of the substrate processing process. In an implementation, in the substrate processing apparatus 30 according to the present embodiment, a plurality of etching holes of which an inclination angle with respect to the vertical direction is reduced may be formed in the substrate S.

Figure 7:
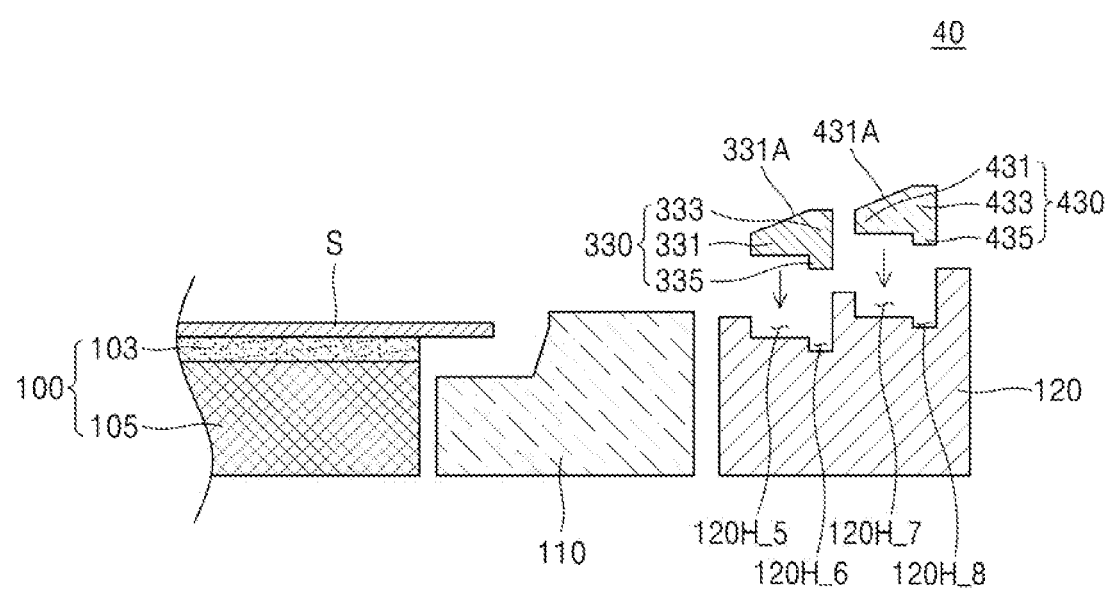
FIG. 7 is an exploded cross-sectional view of a substrate processing apparatus according to an example embodiment.

FIG. 7 is an exploded cross-sectional view of a substrate processing apparatus 40 according to an example embodiment. The same descriptions as given with respect to the substrate processing apparatus 30 of FIGS. 5 and 6 may be omitted for brevity, and differences between the substrate processing apparatus 30 of FIGS. 5 and 6 and the substrate processing apparatuses 40 of FIG. 7 may be mainly described.

Referring to FIG. 7, the substrate processing apparatus 40 according to the example embodiment may include a third floating electrode 330 and a fourth floating electrode 430 outside the third floating electrode 330.

The third floating electrode 330 may include a first inclined portion 331, a first flat portion 333, and a first protrusion portion 335. In an implementation, the fourth floating electrode 430 may include a second inclined portion 431, a second flat portion 433, and a second protrusion portion 435. Configurations and functions of the second inclined portion 431, the second flat portion 433, and the second protrusion portion 435 of the fourth floating electrode 430 may be substantially the same as those of the first inclined portion 331, the first flat portion 333, and the first protrusion portion 335 of the third floating electrode 330, and thus, detailed description thereof may be omitted.

The fourth floating electrode 430 may be inserted into or accommodated in a fourth coupling groove 120H_7 of a second ring 120 to surround an outer edge of the third floating electrode 330. The fourth floating electrode 430 may be on the second ring 120 and may be an electrode that is neither applied with a voltage nor grounded. The fourth floating electrode 430 may be an electrode configured to easily generate plasma along with the third floating electrode 330 due to an electric field crowding effect during a substrate processing process.

In an implementation, the first inclined portion 331 of the third floating electrode 330 and the second inclined portion 431 of the fourth floating electrode 430 may have a first inclined surface 331A and a second inclined surface 431A, respectively. The first inclined surface 331A and the second inclined surface 431A may be exposed at the second ring 120.

In an implementation, each of the first inclined surface 331A of the third floating electrode 330 and the second inclined surface 431A of the fourth floating electrode 430 may have an inclination angle of about 20° to about 60°.

In an implementation, the first flat portion 333 of the third floating electrode 330 may be outside the first inclined portion 331 and may be a portion of the third floating electrode 330, which has a planar surface that is aligned with a portion of a top surface of the second ring 120. In an implementation, the second flat portion 433 of the fourth floating electrode 430 may be outside the second inclined portion 431 and may be a portion of the fourth floating electrode 430, which has a planar surface that is aligned with a portion of the top surface of the second ring 120.

In an implementation, the third floating electrode 330 may include the first protrusion portion 335 which may be inserted or accommodated in a third protrusion groove 120H_6 of the second ring 120. The fourth floating electrode 430 may include the second protrusion portion 435 which may be inserted or accommodated in a fourth protrusion groove 120H_8 of the second ring 120.

In an implementation, the second ring 120 may have the third coupling groove 120H_5 and the third protrusion groove 120H_6 described above. In an implementation, the second ring 120 may have a fourth coupling groove 120H_7 and a fourth protrusion groove 120H_8. The fourth coupling groove 120H_7 may be outside the third coupling groove 120H_5 and may contain or accommodate the fourth floating electrode 430. The fourth protrusion groove 120H_8 may be adjacent to and under or deeper than the fourth coupling groove 120H_7 and may contain or accommodate the second protrusion portion 435 of the fourth floating electrode 430.

In an implementation, the third floating electrode 330 and the fourth floating electrode 430 of the substrate processing apparatus 40 may include the first protrusion portion 335 and the second protrusion portion 435, respectively, and the second ring 120 may include the third protrusion groove 120H_6 and the fourth protrusion groove 120H_8 corresponding or complementary to the first protrusion portion 335 and the second protrusion portion 435, respectively. In an implementation, the third floating electrode 330 and the fourth floating electrode 430 may be easily inserted into or accommodated in the third coupling groove 120H_5 and the fourth coupling groove 120H_7 of the second ring 120. In an implementation, the third floating electrode 330 and the fourth floating electrode 430 may be easily aligned with the second ring 120.

In an implementation, the third floating electrode 330 may be spaced apart from the fourth floating electrode 430. In an implementation, side surfaces of the third floating electrode 330 and side surfaces of the fourth floating electrode 430 may be surrounded by the second ring 120.

In an implementation, the third floating electrode 330 may come in contact with the fourth floating electrode 430. In an implementation, an outer surface of the third floating electrode 330 may come in contact with an inner surface of the fourth floating electrode 430. In an implementation, the inner surface of the third floating electrode 330 and the outer surface of the fourth floating electrode 430 may be surrounded by the second ring 120.

In an implementation, the third floating electrode 330 and the fourth floating electrode 430 may include a ceramic material having higher corrosion resistance than the second ring 120. In an implementation, when the second ring 120 includes quartz, the third floating electrode 330 and the fourth floating electrode 430 may each include, e.g., silicon carbide (SiC), silicon (Si), tungsten carbide (WC), boron carbide ($B_4C$), aluminum oxide ($Al_2O_3$), or yttrium oxide ($Y_2O_3$).

In an implementation, the third floating electrode 330 may include a substantially different material from the fourth floating electrode 430. In an implementation, types of materials of the third floating electrode 330 and the fourth floating electrode 430 may be determined based on a concentration of plasma generated during the substrate processing process.

In an implementation, when plasma having a relatively high concentration is generated over the third floating electrode 330, the third floating electrode 330 may include a material having a higher corrosion resistance than the fourth floating electrode 430. In an implementation, plasma having a relatively high concentration may be generated over the fourth floating electrode 430. In this case, the fourth floating electrode 430 may include a material having a higher corrosion resistance than the third floating electrode 330.

In an implementation, the third floating electrode 330 and the fourth floating electrode 430 may be separated or removed from the second ring 120 in a vertical direction by a separate transfer member. In an implementation, when at least one of the third floating electrode 330 and the fourth floating electrode 430 is etched due to a physical or chemical reaction during a substrate processing process, at least one of the third floating electrode 330 and the fourth floating electrode 430 may be separated from the second ring 120 in the vertical direction by a transfer member.

In an implementation, a bottom-level portion of the inclined surface 331A of the third floating electrode 330 (e.g., a portion where a slope starts inside the third floating electrode 330) may be at substantially the same level as a bottom-level portion of the top surface of the second ring 120. In an implementation, a top-level portion of the inclined surface 331A of the third floating electrode 330 (e.g., a portion where the slope ends outside the third floating electrode 330) may be at substantially the same level as a top-level portion of the top surface of the second ring 120.

In an implementation, a bottom-level portion of the second inclined surface 431A of the fourth floating electrode 430 (e.g., a portion where a slope starts inside the fourth floating electrode 430) may be at substantially the same level as a middle-level portion of the top surface of the second ring 120 (e.g., and may be higher than the bottom-level portion of the top surface of the second ring 120). In an implementation, a top-level portion of the second inclined surface 431A of the fourth floating electrode 430 (e.g., a portion where the slope ends outside the fourth floating electrode 430) may be at substantially the same level as a top-level portion of the top surface of the second ring 120.

In an implementation, as illustrated in the drawings, the substrate processing apparatus 40 may include two floating electrodes. In an implementation, the substrate processing apparatus 40 may include three or more floating electrodes.

The substrate processing apparatus 40 according to the example embodiment may include the third floating electrode 330 and the fourth floating electrode 430, which are in an upper portion of the second ring 120 and include a higher corrosion resistance than the second ring 120, and physical or chemical damage to the third floating electrode 330, the fourth floating electrode 430, and the second ring 120 may be inhibited during a substrate processing process. Accordingly, a shape of plasma generated during the substrate processing process may be uniform, and the yield of the substrate processing process may be improved. In an implementation, in the substrate processing apparatus 40 according to the present embodiment, a plurality of etching holes of which an inclination angle with respect to the vertical direction is reduced may be formed in the substrate S.

In an implementation, as compared to another type of substrate processing apparatus including flat floating electrodes, which do not include the first inclined surface 331A and the second inclined surface 431A, the substrate processing apparatus 40 including the third floating electrode 330 and the fourth floating electrode 430 according to the present embodiment may help reduce physically or chemically etched amounts of the third floating electrode 330, the fourth floating electrode 430, and the second ring 120 during the substrate processing process.

In an implementation, the substrate processing apparatus 40 may generate plasma having a uniform shape during the substrate processing process and improve the yield of the substrate processing process. In an implementation, as compared to another type of substrate processing apparatus including the flat floating electrodes, a plurality of etching holes of which an inclination angle with respect to the vertical direction is reduced may be formed in the substrate S.

By way of summation and review, a shape of plasma generated by a substrate processing apparatus may be affected by a shape, surface roughness, and height of a ring surrounding the ESC. The ring may be etched by a physical or chemical reaction during a substrate processing process, thus resulting in a change in the shape of the plasma generated during the substrate processing process. The change in the shape of the plasma may reduce the yield of the substrate processing process.

One or more embodiments may provide a substrate processing apparatus configured to etch a substrate using plasma.

One or more embodiments may provide a substrate processing apparatus, which may help increase the lifespans of components and improve the yield of a substrate processing process.

A substrate processing apparatus according to embodiments may have an excellent corrosion resistance and include a floating electrode inserted into a groove of a ring, and thus, lifespans of components of the substrate processing apparatus may be increased, and the yield of a substrate processing process may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A substrate processing apparatus, comprising:
    an electrostatic chuck on which a substrate is mountable;
    a ring surrounding the electrostatic chuck, the ring including a first coupling groove; and
    a first floating electrode in the first coupling groove of the ring, the first floating electrode having a ring shape, wherein:
    a top surface of the first floating electrode is exposed at the ring,
    the first floating electrode has a tapered shape including an inclined surface that is inclined in a downward direction toward the electrostatic chuck,
    the first floating electrode includes a coupling protrusion at a lower portion thereof, and
    the ring includes a protrusion groove under the first coupling groove, the protrusion groove accommodating the coupling protrusion of the first floating electrode.

2. The substrate processing apparatus as claimed in claim 1, wherein side surfaces of the first floating electrode are surrounded by the ring.

3. The substrate processing apparatus as claimed in claim 1, wherein:
    the ring includes quartz, and
    the first floating electrode includes silicon carbide (SiC), silicon (Si), tungsten carbide (WC), boron carbide ($B_4C$), aluminum oxide ($Al_2O_3$), or yttrium oxide ($Y_2O_3$).

4. The substrate processing apparatus as claimed in claim 1, further comprising a second floating electrode outside the first floating electrode, the second floating electrode being in the ring,
    wherein:
    the ring further includes a second coupling groove outside the first coupling groove, the second coupling groove accommodating the second floating electrode, and
    the ring surrounds side surfaces of the first floating electrode and side surfaces of the second floating electrode.

5. The substrate processing apparatus as claimed in claim 4, wherein the first floating electrode and the second floating electrode include different materials.

6. A substrate processing apparatus, comprising:
    an electrostatic chuck on which a substrate is mountable;
    a first ring surrounding an edge of the electrostatic chuck;
    a second ring surrounding an edge of the first ring, the second ring including a coupling groove and a protrusion groove under the coupling groove; and
    a floating electrode in the coupling groove of the second ring, the floating electrode having a ring shape and side surfaces of the floating electrode being surrounded by the second ring,
    wherein:
    a top surface of the floating electrode is exposed at the second ring, and
    the floating electrode includes:
        an inclined portion including an inclined surface that is inclined in a downward direction toward the electrostatic chuck;
        a flat portion outside the inclined portion, the flat portion having a planar surface aligned with a portion of a top surface of the second ring; and
        a protrusion portion at a bottom side of the floating electrode, the protrusion portion being in the protrusion groove of the second ring.

7. The substrate processing apparatus as claimed in claim 6, wherein:
    the second ring includes quartz, and
    the floating electrode includes silicon carbide (SiC), silicon (Si), tungsten carbide (WC), boron carbide ($B_4C$), aluminum oxide ($Al_2O_3$), or yttrium oxide ($Y_2O_3$).

8. A substrate processing apparatus, comprising:
    an electrostatic chuck on which a substrate is mountable;
    a first ring surrounding an edge of the electrostatic chuck;
    a second ring surrounding an edge of the first ring, the second ring including a first coupling groove; and
    a first floating electrode in the first coupling groove of the second ring, the first floating electrode having a ring shape.

9. The substrate processing apparatus as claimed in claim 8, wherein side surfaces of the first floating electrode are surrounded by the second ring.

10. The substrate processing apparatus as claimed in claim 8, further comprising a second floating electrode outside the first floating electrode, the second floating electrode being in the second ring,
    wherein:

the second ring further includes a second coupling groove outside the first coupling groove, the second coupling groove accommodating the second floating electrode, and the second ring surrounds side surfaces of the first floating electrode and side surfaces of the second floating electrode.

* * * * *